United States Patent
Sakurai et al.

(10) Patent No.: US 9,841,674 B2
(45) Date of Patent: Dec. 12, 2017

(54) PATTERNING METHOD, AND TEMPLATE FOR NANOIMPRINT AND PRODUCING METHOD THEREOF

(71) Applicant: TOSHIBA MEMORY CORPORATION, Minato-ku, Tokyo (JP)

(72) Inventors: Hideaki Sakurai, Kanagawa (JP); Machiko Suenaga, Kanagawa (JP); Takeharu Motokawa, Kanagawa (JP); Masatoshi Terayama, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 108 days.

(21) Appl. No.: 14/644,783

(22) Filed: Mar. 11, 2015

(65) Prior Publication Data

US 2016/0077436 A1    Mar. 17, 2016

(30) Foreign Application Priority Data

Sep. 11, 2014    (JP) ................. 2014-185503

(51) Int. Cl.
| | | |
|---|---|---|
| G03F 7/26 | (2006.01) | |
| G03F 7/00 | (2006.01) | |
| C03C 17/36 | (2006.01) | |
| C03C 17/38 | (2006.01) | |

(52) U.S. Cl.
CPC ............ *G03F 7/0002* (2013.01); *C03C 17/36* (2013.01); *C03C 17/3649* (2013.01); *C03C 17/38* (2013.01); *C03C 2218/34* (2013.01)

(58) Field of Classification Search
CPC ... G03F 7/42; G03F 7/40; C03C 17/36; C03C 17/42

USPC ......................... 430/323, 324, 328
See application file for complete search history.

(56) References Cited

U.S. PATENT DOCUMENTS

| | | | |
|---|---|---|---|
| 2013/0236658 A1 | 9/2013 | Sato | |
| 2014/0231388 A1* | 8/2014 | Yonemitsu | G03F 7/40 216/49 |
| 2014/0287587 A1* | 9/2014 | Lee | B81C 1/00031 438/694 |
| 2015/0225850 A1* | 8/2015 | Arora | C23C 16/45525 216/51 |

FOREIGN PATENT DOCUMENTS

| | | |
|---|---|---|
| JP | 2008-036491 | 2/2008 |
| JP | 2011-018778 | 1/2011 |
| JP | 4673266 | 4/2011 |
| JP | 5222805 | 3/2013 |
| JP | 2013-187387 | 9/2013 |

* cited by examiner

*Primary Examiner* — Daborah Chacko Davis
(74) *Attorney, Agent, or Firm* — Finnegan, Henderson, Farabow, Garrett & Dunner, L.L.P.

(57) ABSTRACT

A patterning method according to one embodiment includes forming a ground layer on a processing target layer. The ground layer has higher affinity for one of a first segment and a second segment contained in a self-assembly material than for the other segment. The neutral layer is patterned on the ground layer. The neutral layer is neutral to the first segment and the second segment. Exposing surfaces of the ground layer and the neutral layer is irradiated with an energy ray. The self-assembly material is applied onto the ground layer and the neutral layer. The self-assembly material is phase-separated into a first domain including the first segment and a second domain including the second segment. One of the first domain and the second domain is selectively removed.

21 Claims, 9 Drawing Sheets

PATTERNING METHOD, AND TEMPLATE FOR NANOIMPRINT AND PRODUCING METHOD THEREOF

CROSS REFERENCE TO RELATED APPLICATION(S)

This application is based upon and claims the benefit of priority from the prior Japanese Patent Application No. 2014-185503, filed on Sep. 11, 2014, the entire contents of which are incorporated herein by reference.

FIELD

Embodiments described herein relate generally to a patterning method, and a template for nanoimprint and a producing method thereof.

BACKGROUND

In recent years, use of directed self-assembly (DSA) has received attention as a fine patterning technique. In a patterning method using DSA, a block copolymer (BCP) is applied onto a guide pattern and microphase-separated to form a microphase separation pattern along the guide pattern. For the guide pattern, a chemical guide or a physical guide is used.

A guide pattern using a chemical guide includes two surface regions: a pinning region and a neutralized region. In the guide pattern, one of segments contained in a block copolymer is pinned to a pinning region to microphase-separate the block copolymer along the guide pattern.

DETAILED DESCRIPTION

Embodiments will now be explained with reference to the accompanying drawings. The present invention is not limited to the embodiments.

A patterning method according to one embodiment includes forming a ground layer on a processing target layer. The ground layer has higher affinity for one of a first segment and a second segment contained in a self-assembly material than for the other segment. The neutral layer is patterned on the ground layer. The neutral layer is neutral to the first segment and the second segment. Exposing surfaces of the ground layer and the neutral layer is irradiated with an energy ray. The self-assembly material is applied onto the ground layer and the neutral layer. The self-assembly material is phase-separated into a first domain including the first segment and a second domain including the second segment. One of the first domain and the second domain is selectively removed.

(First Embodiment)

A patterning method according to the first embodiment will be described with reference to FIGS. 1 to 8. In the patterning method, a fine pattern is formed on a processing object using a self-assembly material. The self-assembly material is, for example, a block copolymer such as a diblock copolymer or a triblock copolymer, but is not limited thereto. The block copolymer is a copolymer with a plurality of kinds of polymers chemically bonded to one another. Hereinafter, each polymer that forms a block copolymer is referred to as a segment.

The block copolymer includes a hydrophilic first segment and a hydrophobic second segment. The hydrophilicity and hydrophobicity herein refers to a relative nature. That is, the first segment is a segment having the highest hydrophilicity among segments that form the block copolymer, and the second segment is a segment having the highest hydrophobicity (lowest hydrophilicity) among segments that form the block copolymer. Therefore, the first segment has hydrophilicity higher than that of the second segment, and the second segment has hydrophobicity higher than that of (hydrophobicity lower than that of) the first segment.

In this embodiment, the block copolymer is, for example, PS-b-PMMA or PS-b-PDMS, but is not limited thereto. When the block copolymer is PS-b-PMMA, the first segment is PMMA (polymethyl methacrylate), and the second segment is PS (polystyrene).

Here, FIGS. 1 to 8 show a processing object in the steps of the patterning method. In FIGS. 1 to 8, A corresponds to a plan view, and B corresponds to a sectional view along line A-A' in A.

Figure 1A:
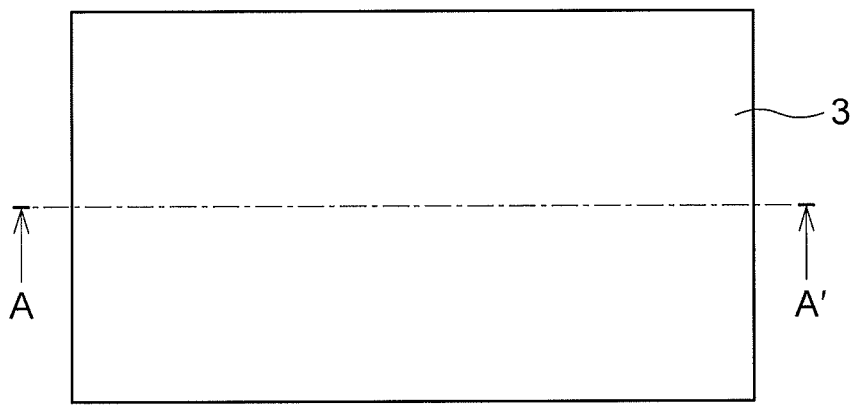
FIGS. 1A and 1B are a plan view and a sectional view, respectively, for explaining a patterning method according to a first embodiment.
Figure 1B:
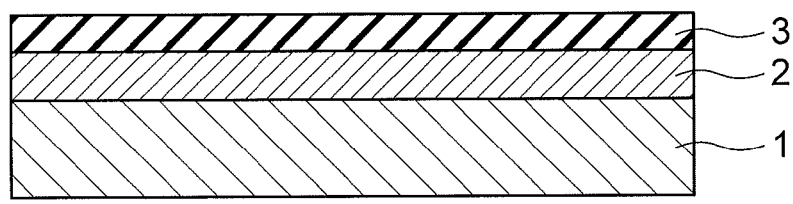

First, as shown in FIGS. 1A and 1B, a ground layer 2 is formed on a processing target layer 1, and a neutral layer 3 is formed on the ground layer 2.

The processing target layer 1 is a processing object on which a line-and-space pattern is formed using the patterning method. In FIG. 1, the processing target layer 1 is, for example, a semiconductor substrate, a glass substrate, a quartz glass substrate, or any layer formed on such a substrate.

The ground layer 2 is a hard mask for transferring to the processing target layer 1 a microphase separation pattern (line-and-space pattern) of a block copolymer, which is formed in a later step.

The ground layer 2 is formed of any material having an etching selection ratio to the processing target layer 1 and having affinity for one of the first segment and the second segment of the block copolymer. The affinity herein refers to a relative nature. That is, the ground layer 2 having affinity for the first segment means that affinity of the ground layer 2 to the first segment is higher than affinity of the ground layer 2 to the second segment. Similarly, the ground layer 2 having affinity for the second segment means that affinity of the ground layer 2 to the second segment is higher than affinity of the ground layer 2 to the first segment.

Examples of the above-mentioned material include Cr, Si, Mo and Ta. The ground layer 2 is formed by laminating the material on the processing target layer 1 using a sputtering method or the like. When the block copolymer is PS-b-PMMA, the ground layer 2 is preferably a Cr film or chromium oxide film having affinity for PMMA.

The neutral layer 3 is a thin film neutral to the first segment and the second segment of the block copolymer. The term "neutral" means having the same degree of affinity for the first segment and the second segment. The neutral layer 3 can be formed of, for example, a mixture of a single body of the first segment and a single body of the second segment, or a random copolymer of the first segment and the second segment.

Specifically, when the block copolymer is PS-b-PMMA, a mixture of PS and PMMA, or PS-r-PMMA that is a random copolymer of PS and PMMA is dissolved in PGMEA (polyethylene glycol monomethyl ether acetate) in a concentration of 1.0 wt %, and the resulting solution is spin-applied at a rotation number of 2000 rpm, and baked at 110° C. for 90 seconds, and then at 240° C. for 3 minutes on a hot plate. The neutral layer 3 can be hereby formed. The film thickness of the neutral layer 3 is, for example, 5 nm.

Figure 2A:
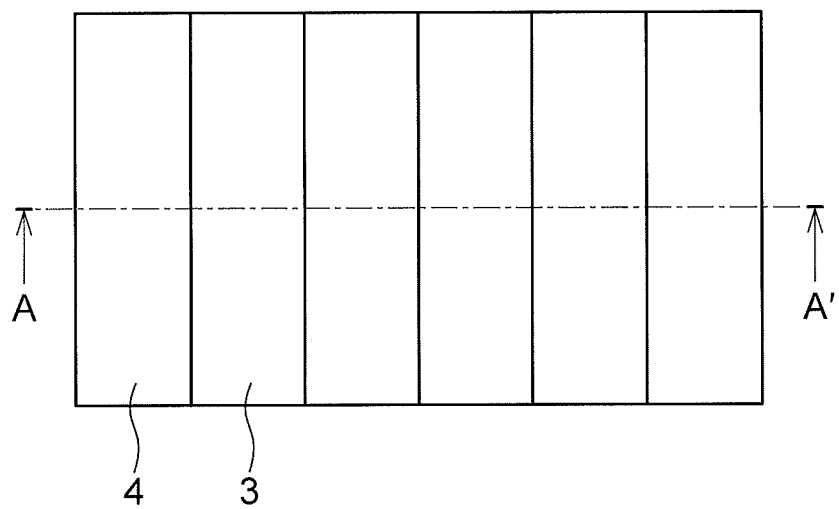
FIGS. 2A and 2B are a plan view and a sectional view, respectively, for explaining the patterning method according to the first embodiment.
Figure 2B:
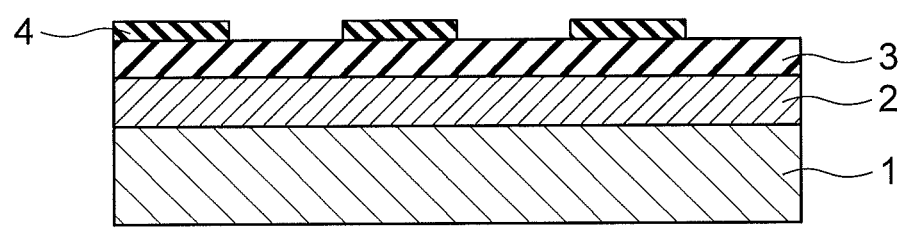

Next, as shown in FIGS. 2A and 2B, a resist pattern 4 in the shape of a line-and-space pattern is formed on the neutral layer 3. The resist pattern 4 is formed by spin-applying a resist material onto the entire surface of the neutral layer 3, and removing a part of the resist material by exposure, baking and development. Exposure is performed using, for example, electron beams.

More specifically, a space portion of the line-and-space pattern shape in the resist material applied onto the neutral layer 3 is removed. The neutral layer 3 is exposed from the space portion. When PS-b-PMMA with a pitch $L_0$ of 30 nm is used as a block copolymer, the resist material is removed so that the half pitch of the line-and-space pattern is, for example, 45 nm ($L_0 \times 3/2$). The pitch $L_0$ is a pitch of the microphase separation pattern.

Figure 3A:
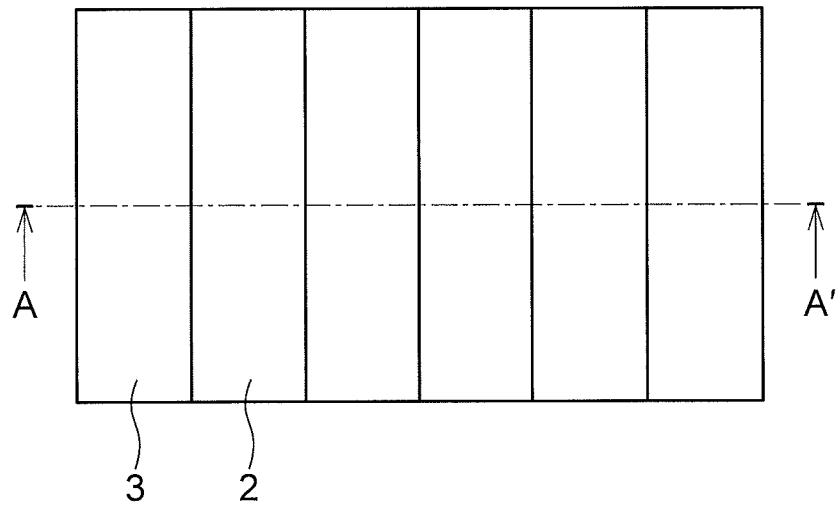
FIGS. 3A and 3B are a plan view and a sectional view, respectively, for explaining the patterning method according to the first embodiment.
Figure 3B:
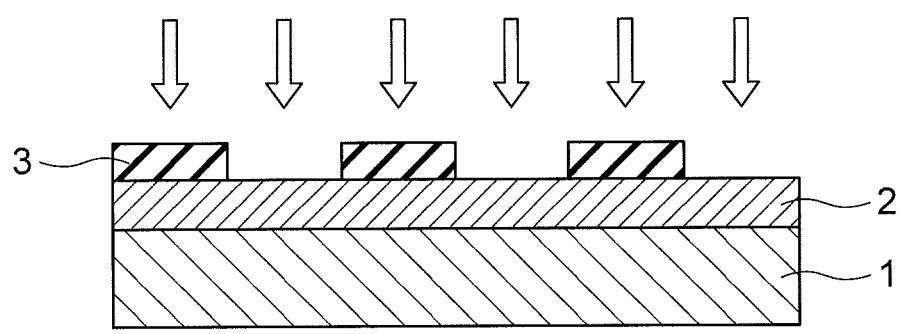

Next, as shown in FIGS. 3A and 3B, the neutral layer 3 is etched with the resist pattern 4 as a mask, and the resist pattern 4 is removed. Etching of the neutral layer 3 is performed by, for example, dry etching using oxygen. The resist pattern 4 is striped using a stripping liquid. As the stripping liquid, for example, an organic solvent containing at least one of N-methylpyrrolidone, propylene glycol, tetramethylammonium hydroxide and dimethyl sulfoxide is used. After the resist pattern 4 is removed, the surface of the ground layer 2 and the surface of the neutral layer 3 are washed with a washing liquid, and rinsed with ultrapure water.

The resist pattern 4 is hereby transferred to the neutral layer 3, so that a guide pattern is formed in the shape of a line-and-space pattern. The guide pattern includes the ground layer 2 exposed from a portion in which the neutral layer 3 is removed (space portion), and the neutral layer 3 which is not removed and remains (line portion). The guide pattern serves as a guide for regularly arranging the first segment and the second segment in microphase separation of the block copolymer in a later step. In this guide, the ground layer 2 functions as a chemical guide that forms the pinning region, and the neutral layer 3 functions as a physical guide and a chemical guide that forms the neutralized region.

In this embodiment, a guide pattern is formed, followed by irradiating the surface of the guide pattern, i.e. the surface of the ground layer 2 and the surface of the neutral layer 3, with an energy ray. The energy ray is, for example, one of an electron beam, EUV light, VUV light, UV light, an ion beam, an X ray and visible light.

By irradiating the surface of the guide pattern with an energy ray, pinning performance of the guide pattern can be improved. This is because irradiation of an energy ray modifies the surface of the guide pattern, and removes a stripping liquid and dusts that are deposited on the surface of the guide pattern.

Further, when the surface of the guide pattern is modified, affinity between the guide pattern and the block copolymer is improved, so that occurrence of coating unevenness of the block copolymer in a later step can be suppressed.

Preferably, the ground layer 2 and the neutral layer 3 are annealed at a predetermined temperature at the time of irradiating the surface of the guide pattern with an energy ray. Modification of the surface of the guide pattern, and removal of a stripping liquid and dusts can be hereby effectively performed.

A temperature for annealing may be selected according to materials of the neutral layer 3 and the ground layer 2. For example, the temperature for annealing is preferably a temperature equal to or lower than the melting point of the neutral layer 3. Degradation of the shape of the line-and-space pattern formed on the neutral layer 3 can be hereby prevented. For example, when the ground layer 2 is a Cr film or a chromium oxide film, the temperature for annealing is preferably 200° C. or lower. Damage to the ground layer 2 due to annealing can be hereby suppressed.

Figure 4A:
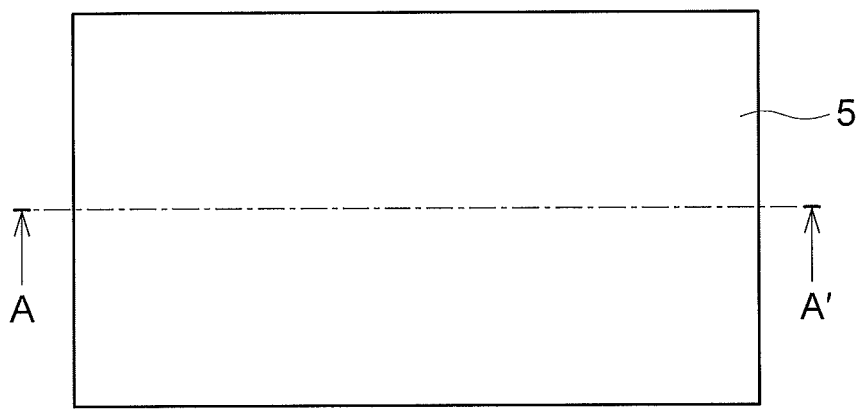
FIGS. 4A and 4B are a plan view and a sectional view, respectively, for explaining the patterning method according to the first embodiment.
Figure 4B:
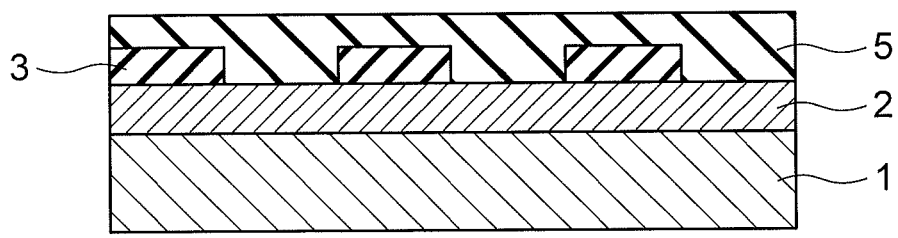

Next, as shown in FIGS. 4A and 4B, a block copolymer including the first segment and the second segment is spin-applied onto the ground layer 2 and the neutral layer 3 to form a block copolymer layer 5. When the block copolymer is PS-b-PMMA, PS-b-PMMA is dissolved in PGMEA in a concentration of about 1.0 wt %, and the resulting solution is spin-applied at a rotation number of 2000 rpm. The film thickness of the block copolymer layer 5 from the ground layer 2 is, for example, 35 nm.

Figure 5A:
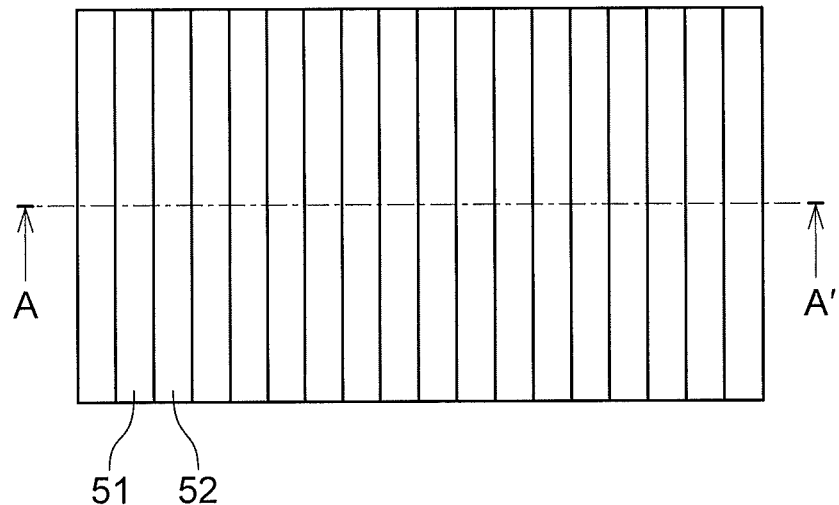
FIGS. 5A and 5B are a plan view and a sectional view, respectively, for explaining the patterning method according to the first embodiment.
Figure 5B:
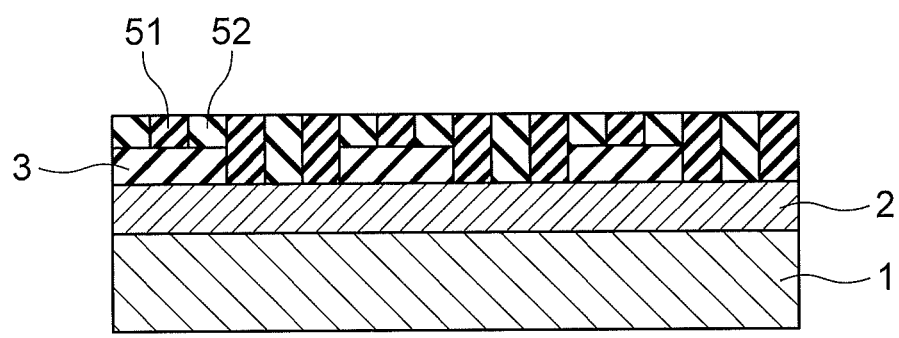

Next, as shown in FIGS. 5A and 5B, the block copolymer layer 5 is annealed. The block copolymer layer 5 is hereby microphase-separated into a first domain 51 including the first segment and a second domain 52 including the second segment, so that a microphase separation pattern is formed.

By this annealing treatment, a microphase separation pattern of lamellar structure in which the first domain 51 and the second domain 52 are alternately arranged in the plane direction is formed on the guide pattern. This is because the block copolymer is microphase-separated along the guide pattern.

For example, when the ground layer 2 has affinity for the first segment, the first segment is pinned to a portion in which the ground layer 2 is exposed, i.e. the space portion (pinning region) of the guide pattern, so that the first domain 51 is formed. The first segment and the second segment are alternately arranged with the first domain 51 as a starting point.

The microphase separation pattern of lamellar structure shown in FIG. 5 is hereby formed. When the ground layer 2 has affinity for the second segment, similarly a microphase separation pattern of lamellar structure in which the positions of the first domain 51 and the second domain 52 in FIG. 5 are replaced by each other is formed on the guide pattern.

Thus, the microphase separation pattern is formed along the guide pattern, and therefore has a line-and-space pattern shape parallel to the guide pattern. Further, the microphase separation pattern has a line-and-space pattern finer than the guide pattern because a plurality of patterns are formed in each of the line portion and the space portion of the guide pattern.

For example, the block copolymer is PS-b-PMMA, the block copolymer is annealed under a nitrogen atmosphere at 240° C. for 10 minutes. PS-b-PMMA is hereby microphase-separated, so that a microphase separation pattern in the shape of a line-and-space pattern, which has a half pitch of, for example, about 15 nm and includes a PMMA domain (first domain 51) and a PS domain (second domain 52), is formed. In a later step, the microphase separation pattern is transferred to the processing target layer 1.

The dimension of each of the space portion and the line portion of the guide pattern may be any dimension that allows microphase separation of the block copolymer layer 5 to be guided.

Figure 6A:
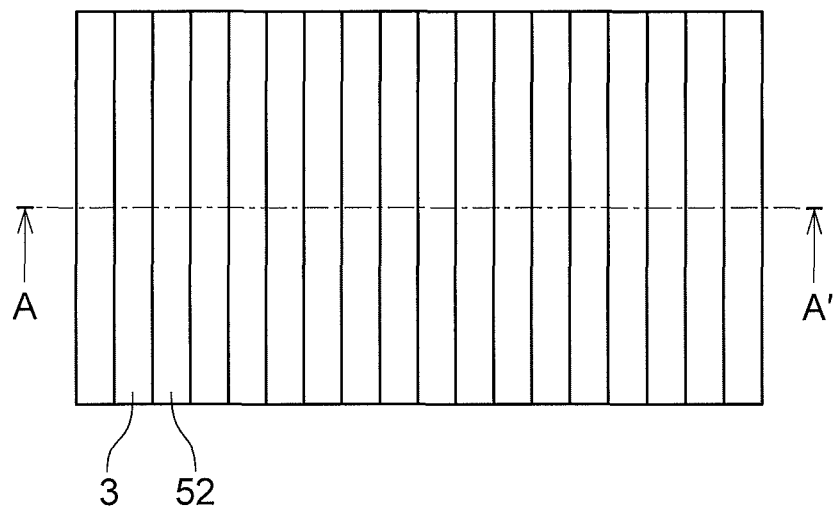
FIGS. 6A and 6B are a plan view and a sectional view, respectively, for explaining the patterning method according to the first embodiment.
Figure 6B:
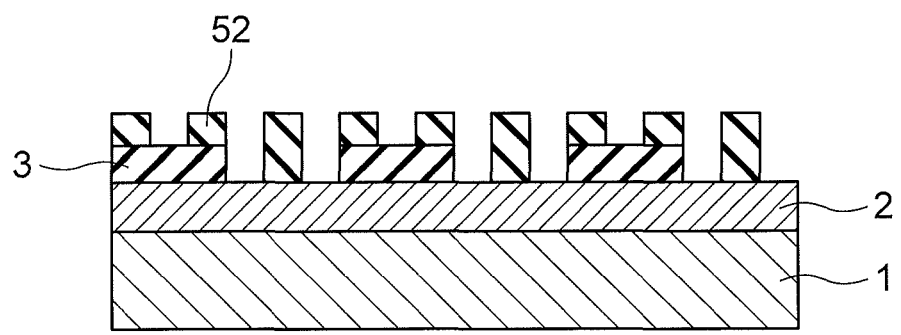

Next, the first domain 51 is selectively removed by etching as shown in FIGS. 6A and 6B. A line-and-space pattern with the second domain 52 as a line portion is hereby formed on the guide pattern.

For example, when the block copolymer is PS-b-PMMA, PMMA (first domain 51) can be selectively removed by dry etching using an oxygen plasma.

Instead of the first domain 51, the second domain 52 may be selectively removed. In this case, line-and-space pattern with the first domain 51 as a line portion is formed on the guide pattern.

Figure 7A:
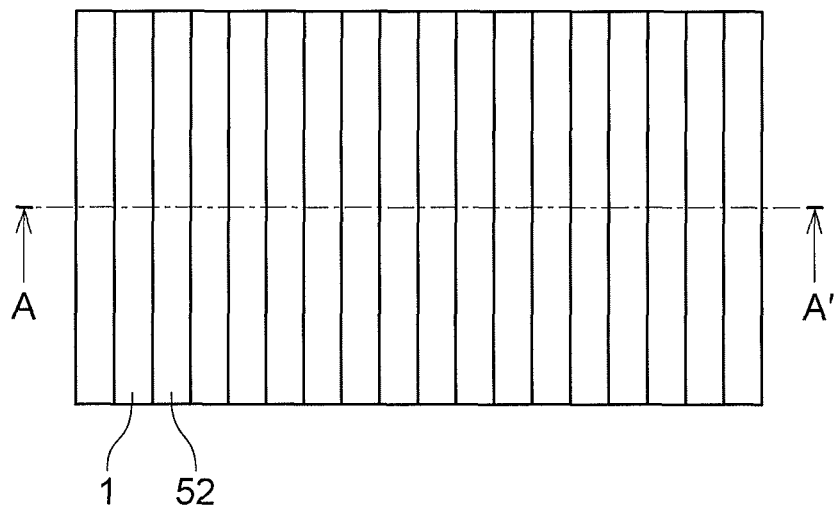
FIGS. 7A and 7B are a plan view and a sectional view, respectively, for explaining the patterning method according to the first embodiment.
Figure 7B:
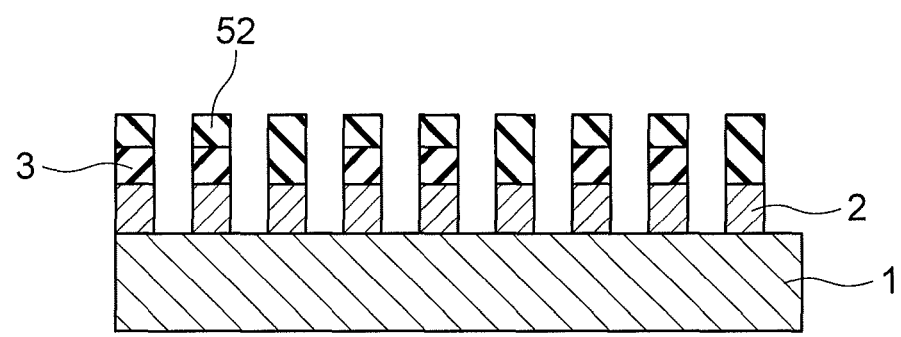

Next, as shown in FIGS. 7A and 7B, the ground layer 2 is etched with the second domain 52 as a mask. The microphase separation pattern is hereby transferred to the ground layer 2, so that a line-and-space pattern is formed. Etching of the ground layer 2 can be performed by, for example, dry etching using a chlorine-based gas. For example, when the block copolymer is PS-b-PMMA, a line-and-space pattern having a half pitch of about 15 nm is formed on the ground layer 2.

When the second domain 52 is selectively removed in the previous step, the ground layer 2 may be etched with the first domain 51 as a mask. A line-and-space pattern in which the line portion and the space portion in FIG. 7B are replaced by each other is hereby formed on the ground layer 2.

Figure 8A:
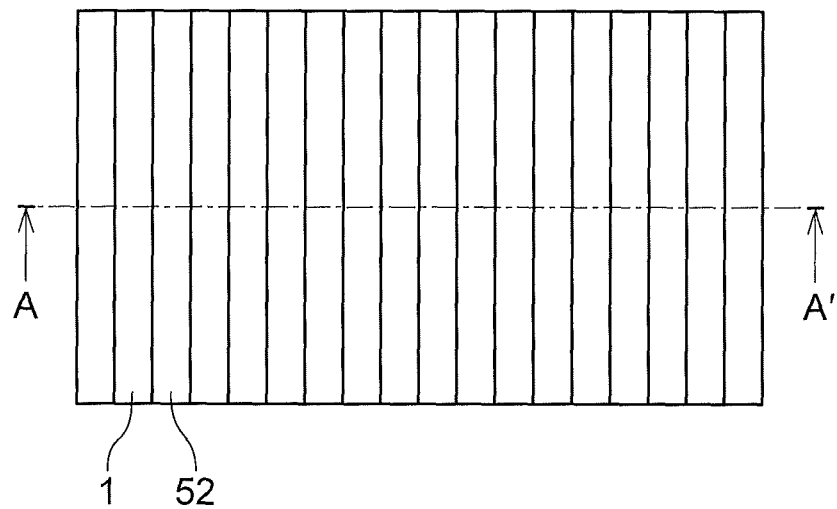
FIGS. 8A and 8B are a plan view and a sectional view, respectively, for explaining the patterning method according to the first embodiment.
Figure 8B:
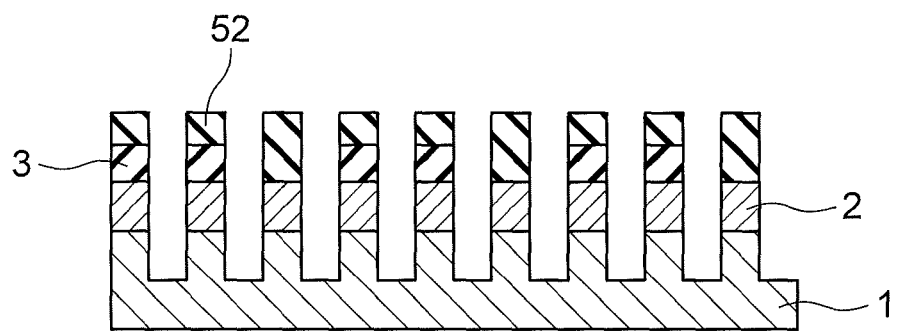

Next, as shown in FIGS. 8A and 8B, the processing target layer 1 is etched with the neutral layer 3, the first domain 51, the second domain 52 and the ground layer 2 as a mask. The depth of etching of the processing target layer 1 is, for example, 30 nm. The line-and-space pattern of the ground layer 2 is hereby transferred to the processing target layer 1, so that a line-and-space pattern is formed on the processing target layer 1. For example, when the processing target layer 1 is a quartz glass substrate, the processing target layer 1 can be etched by dry etching using a fluorine-based gas.

Thereafter, the neutral layer 3, the first domain 51, the second domain 52 and the ground layer 2 which remain on the processing target layer 1 are removed by wet etching.

When the resist pattern 4 is striped using a stripping liquid that is an organic solvent before irradiation of an energy ray as in a conventional patterning method, organic substances may be deposited on the surface of the guide pattern, and a chemical change may occur at the surface of the guide pattern. After the rinsing step, dusts in air may be deposited on the surface of the guide pattern. Due to these factors, the surface state of the guide pattern may be changed to make the pinning region and neutralized region hydrophilic or hydrophobic. When the surface state of the guide pattern is changed, pinning performance of the guide pattern is deteriorated, leading to occurrence of abnormal arrangement in the microphase separation pattern formed in a later step.

However, according to the above-described patterning method according to this embodiment, by irradiating the surface of the guide pattern with an energy ray, the surface of the guide pattern is modified, and a stripping liquid and dusts deposited on the surface of the guide pattern can be removed. Pinning performance of the guide pattern can be hereby improved, so that abnormal arrangement of the microphase separation pattern formed in a later step can be suppressed.

By irradiation of an energy ray, affinity of the surface of the guide pattern can be improved, so that occurrence of coating unevenness of the block copolymer can be suppressed.

This patterning method can be applied for patterning of a semiconductor substrate and a quartz glass substrate. Therefore, the patterning method can be used to produce a semiconductor substrate, a photomask, a template for nanoimprint, a display, a solar panel and the like.

(Second Embodiment)

A patterning method according to the second embodiment will be described. In the patterning method according to this embodiment, the thickness of a resist pattern 4 is set according to an etching rate ratio of the neutral layer 3 and the resist pattern 4.

Specifically, when the ratio of the etching rate of the neutral layer 3 and the etching rate of the resist pattern 4 (etching rate ratio) is A:B, the resist pattern 4 is formed so that the thickness of the resist pattern 4 is B/A times or less as large as the thickness of the neutral layer 3. By setting the thickness of the resist pattern 4 in this manner, the resist pattern 4 is all removed at the time when etching of the neutral layer 3 is completed.

In this embodiment, the neutral layer 3 is etched to form a guide pattern, the surface of the guide pattern is then washed and rinsed, and the surface of the guide pattern is irradiated with an energy ray. Subsequent steps are similar to those in the first embodiment.

As described above, the patterning method according to this embodiment does not require a step of stripping the resist pattern 4, and therefore the number of steps can be reduced. A stripping liquid does not come into contact with the surface of the guide pattern, and therefore deterioration of pinning performance can be suppressed. Further, by irradiation of an energy ray, pinning performance of the guide pattern can be improved, and coating unevenness of the block copolymer can be suppressed.

(Third Embodiment)

A patterning method according to the third embodiment will be described with reference to FIG. 9. In the patterning method according to this embodiment, a material neutral to a first segment and a second segment of block copolymer is used as a resist material.

Figure 9A:
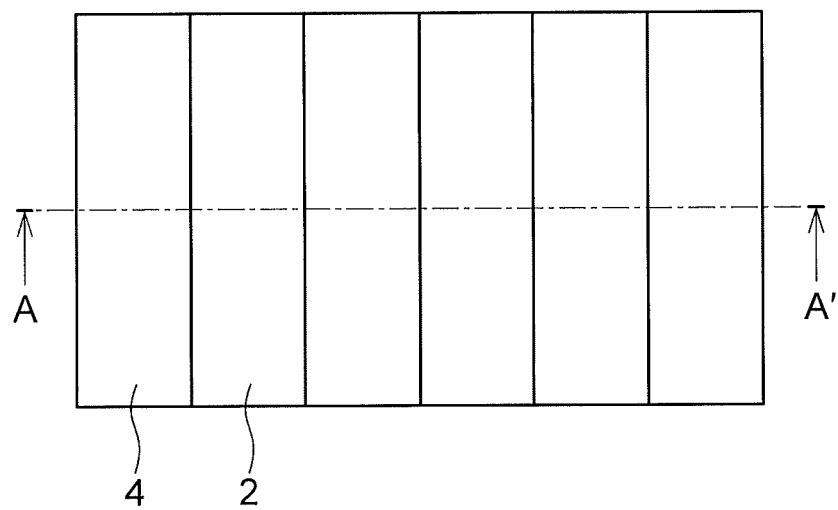
FIGS. 9A and 9B are a plan view and a sectional view, respectively, for explaining a patterning method according to a third embodiment.
Figure 9B:
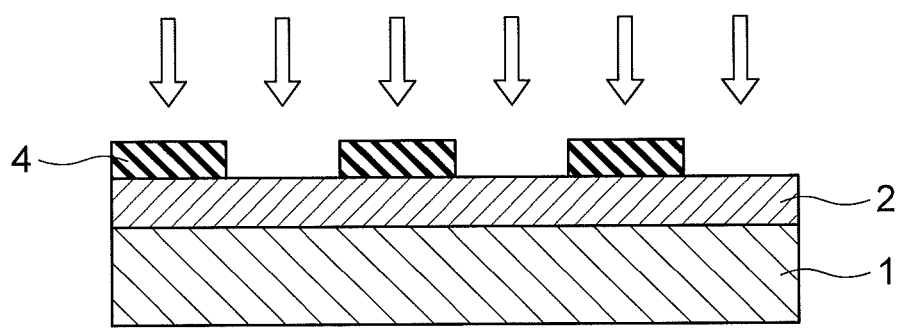

Next, as shown in FIGS. 9A and 9B, a ground layer 2 is formed on a processing target layer 1, and a resist pattern 4 in the shape of a line-and-space pattern is formed on the ground layer 2. The resist pattern 4 is formed by spin-applying a resist material onto the ground layer 2, and removing a part of the resist material by exposure and development.

The formed resist pattern 4 is neutral to the block copolymer, and therefore serves as the neutral layer 3 in the first embodiment. That is, in this embodiment, the neutral layer 3 is formed of a resist material. Therefore, when the resist pattern 4 is formed, a guide pattern including the ground layer 2 and the resist pattern 4 is formed.

In this embodiment, the surface of the guide pattern is irradiated with an energy ray after the resist pattern 4 is formed. Subsequent steps are similar to those in the first embodiment.

As described above, the patterning method according to this embodiment does not require a step of forming the neutral layer 3 and a step of stripping the resist pattern 4, and therefore the number of steps can be reduced. A stripping liquid does not come into contact with the surface of the guide pattern, and therefore deterioration of pinning performance can be suppressed. Further, by irradiation of an energy ray, pinning performance of the guide pattern can be improved, and coating unevenness of the block copolymer can be suppressed.

The resist pattern 4 in the first embodiment can also be formed of a resist material neutral to the block copolymer. In this case, the surface of the guide pattern may be irradiated with an energy ray without removing the resist pattern 4 after the neutral layer 3 is etched. Consequently, a step of removing the resist pattern 4 is not required, and therefore the number of steps for patterning can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A patterning method comprising:
    forming a ground layer on a processing target layer, the ground layer having higher affinity for one of a first segment and a second segment contained in a self-assembly material than for the other segment;
    forming and patterning a neutral layer neutral to the first segment and the second segment on the ground layer;
    irradiating exposed surfaces of the ground layer and the neutral layer with an energy ray;
    applying the self-assembly material onto the irradiated ground layer and the irradiated neutral layer;
    phase-separating the self-assembly material into a first domain including the first segment and a second domain including the second segment by annealing the self-assembly material; and
    selectively removing one of the first domain and the second domain.

2. The method according to claim 1, further comprising annealing the ground layer and the neutral layer at a predetermined temperature in irradiation of the energy ray.

3. The method according to claim 2, wherein the predetermined temperature is 200° C. or lower.

4. The method according to claim 1, wherein
    the patterning of the neutral layer comprises:
    forming the neutral layer on the ground layer;
    forming a resist pattern on the neutral layer; and
    etching the neutral layer with the resist pattern as a mask.

5. The method according to claim 4, further comprising stripping the resist pattern with a stripping liquid after etching the neutral layer.

6. The method according to claim 1, wherein the energy ray is one of an electron beam, EUV light, VUV light, UV light, an ion beam, an X ray and visible light.

7. The method according to claim 1, wherein the processing target layer is a quartz glass substrate.

8. The method according to claim 1, wherein the neutral layer contains a resist material.

9. The method according to claim 1, wherein the exposed surfaces of the ground layer and the surface of the neutral layer are modified by the irradiating the exposed surfaces of the ground layer and the surface of the neutral layer with an energy ray.

10. The method according to claim 1, further comprising washing the ground layer and the neutral layer after the patterning the neutral layer.

11. The method according to claim 10, wherein the ground layer and the neutral layer are washed with ultrapure water.

12. A producing method of a template for nanoimprint, the method comprising:
    forming a ground layer on a processing target layer, the ground layer having higher affinity for one of a first segment and a second segment contained in a self-assembly material than for the other segment;
    forming and patterning a neutral layer neutral to the first segment and the second segment on the ground layer;
    irradiating exposed surfaces of the ground layer and the neutral layer with an energy ray;
    applying the self-assembly material onto the irradiated ground layer and the irradiated neutral layer;
    phase-separating the self-assembly material into a first domain including the first segment and a second domain including the second segment by annealing the self-assembly material; and
    selectively removing one of the first domain and the second domain.

13. A patterning method comprising:
    forming a ground layer on a processing target layer, the ground layer having higher affinity for one of a first segment and a second segment contained in a self-assembly material than for the other segment;
    forming a neutral layer on the ground layer;
    forming a resist pattern on a neutral layer;
    etching the neutral layer with the resist pattern as a mask and exposing surfaces of the ground layer, the neutral layer neutral to the first segment and the second segment on the ground layer;
    irradiating the exposed surfaces of the ground layer and the etched neutral layer with an energy ray;
    applying the self-assembly material onto the irradiated ground layer and the irradiated neutral layer;
    phase-separating the self-assembly material into a first domain including the first segment and a second domain including the second segment by annealing the self-assembly material; and
    selectively removing one of the first domain and the second domain.

14. The method according to claim 13, further comprising annealing the ground layer and the neutral layer at a predetermined temperature in irradiation of the energy ray.

15. The method according to claim 14, wherein the predetermined temperature is 200° C. or lower.

16. The method according to claim 13, further comprising stripping the resist pattern with a stripping liquid after etching the neutral layer.

17. The method according to claim 13, wherein the processing target layer is a quartz glass substrate.

18. The method according to claim 13, wherein the neutral layer contains a resist material.

19. The method according to claim 13, wherein the exposed surfaces of the ground layer and the surface of the neutral layer are modified by the irradiating the exposed surfaces of the ground layer and the surface of the neutral layer with an energy ray.

20. The method according to claim 13, further comprising washing the ground layer and the neutral layer after the patterning the neutral layer.

21. The method according to claim 20, wherein the ground layer and the neutral layer are washed with ultrapure water.

* * * * *